United States Patent [19]

Edmond et al.

[11] Patent Number: 5,523,589
[45] Date of Patent: Jun. 4, 1996

[54] VERTICAL GEOMETRY LIGHT EMITTING DIODE WITH GROUP III NITRIDE ACTIVE LAYER AND EXTENDED LIFETIME

[75] Inventors: John A. Edmond; Gary E. Bulman, both of Cary; Hua-Shuang Kong, Raleigh; Vladimir Dmitriev, Fuquay-Varina, all of N.C.

[73] Assignee: Cree Research, Inc., Durham, N.C.

[21] Appl. No.: 309,251

[22] Filed: Sep. 20, 1994

[51] Int. Cl.$^6$ .................. H01L 31/0312; H01L 33/00
[52] U.S. Cl. .................. 257/77; 257/96; 257/97; 257/103
[58] Field of Search .................. 257/77, 96, 97, 257/103; 372/43, 44, 45, 46

[56] References Cited

U.S. PATENT DOCUMENTS

| | | | |
|---|---|---|---|
| 5,243,204 | 9/1993 | Suzuki et al. | 257/77 |
| 5,247,533 | 9/1993 | Okazaki et al. | 372/45 |
| 5,273,933 | 12/1993 | Hatano et al. | 437/127 |
| 5,290,393 | 3/1994 | Nakamura | 156/613 |
| 5,306,662 | 4/1994 | Nakamura et al. | 437/107 |
| 5,313,078 | 5/1994 | Fujii et al. | 257/77 |
| 5,338,944 | 8/1994 | Edmond et al. | 257/76 |
| 5,387,804 | 2/1995 | Suzuki et al. | 257/77 |
| 5,393,993 | 2/1995 | Edmond et al. | 257/77 |
| 5,416,342 | 5/1995 | Edmond et al. | 257/76 |
| 5,432,808 | 7/1995 | Hatano et al. | 372/45 |

FOREIGN PATENT DOCUMENTS

0541373A2  5/1993  European Pat. Off.

OTHER PUBLICATIONS

V. A. Dmitriev, *SiC–Based Solid Solutions: Technology and Properties,* Springer Proceedings in Physics, vol. 56, 1992, pp. 3–14.

J. N. Kuznia et al., *Influence of Buffer Layers on the Deposition of High Quality Single Crystal GaN Over Sapphire Substrates,* J. Appl. Phys., vol. 73, No. 9, May 1993, pp. 4700–4702.

M. Asif Khan et al., *The Nature of Donor Conduction in n–GaN,* J. Appl. Phys., vol. 74, No. 9, Nov. 1993, pp. 5901–5903.

Isamu Akasaki et al., *Effects of AlN Buffer Layer on Crystallographic Structure and on Electrical and Optical Properties of GaN and $Ga_{1-x}Al_xN$ ($0<x\leq0.4$) Films Grown on Sapphire Substrate by MOVPE,* Journal of Crystal Growth, vol. 98, 1989, pp. 209–219.

Shuji Nakamura, *GaN Growth Using GaN Buffer Layer,* Japanese Journal of Applied Physics, vol. 30, No. 10A, Oct. 1991, pp. L1705–L1707.

Shuji Nakamura et al., *Candela–Class High–Brightness InGaN/AlGaN Double–Heterostructure Blue–Light–Emitting Diodes,* Appl. Phys. Lett., vol. 64, No. 13, Mar. 1994, pp. 1687–1689.

Shuji Nakamura, *InGaN/AlGaN Double–Heterostructure Blue LEDs* (undated).

*Primary Examiner*—Ngân V. Ngô
*Attorney, Agent, or Firm*—Bell, Seltzer, Park & Gibson

[57] ABSTRACT

A light emitting diode emits in the blue portion of the visible spectrum and is characterized by an extended lifetime. The light emitting diode comprises a conductive silicon carbide substrate; an ohmic contact to the silicon carbide substrate; a conductive buffer layer on the substrate and selected from the group consisting of gallium nitride, aluminum nitride, indium nitride, ternary Group III nitrides having the formula $A_xB_{1-x}N$, where A and B are Group III elements and where x is zero, one, or a fraction between zero and one, and alloys of silicon carbide with such ternary Group III nitrides; and a double heterostructure including a p-n junction on the buffer layer in which the active and heterostructure layers are selected from the group consisting of binary Group III nitrides and ternary Group III nitrides.

36 Claims, 4 Drawing Sheets

VERTICAL GEOMETRY LIGHT EMITTING DIODE WITH GROUP III NITRIDE ACTIVE LAYER AND EXTENDED LIFETIME

FIELD OF THE INVENTION

This invention relates to optoelectronic devices and more particularly to light emitting diodes formed from Group III nitrides (i.e., Group III of the Periodic Table of the Elements) that will produce output in the blue to ultraviolet portions of the electromagnetic spectrum.

BACKGROUND OF THE INVENTION

Light emitting diodes ("LEDs") are p-n junction devices that have been found to be useful in various roles as the field of optoelectronics has grown and expanded over the years. Devices that emit in the visible portion of the electromagnetic spectrum have been used as simple status indicators, dynamic power level bar graphs, and alphanumeric displays in many applications, such as audio systems, automobiles, household electronics, and computer systems, among many others. Infrared devices have been used in conjunction with spectrally matched phototransistors in optoisolators, hand-held remote controllers, and interruptive, reflective, and fiber-optic sensing applications.

An LED operates based on the recombination of electrons and holes in a semiconductor. When an electron carrier in the conduction band combines with a hole in the valence band, it loses energy equal to the bandgap in the form of an emitted photon; i.e., light. The number of recombination events under equilibrium conditions is insufficient for practical applications but can be enhanced by increasing the minority carrier density.

In an LED, the minority carrier density is conventionally increased by forward biasing the diode. The injected minority carriers radiatively recombine with the majority carriers within a few diffusion lengths of the junction edge. Each recombination event produces electromagnetic radiation, i.e, a photon. Because the energy loss is related to the bandgap of the semiconductor material, the bandgap characteristics of the LED material has been recognized as being important.

As with other electronic devices, however, there exists both the desire and the need for more efficient LEDs, and in particular, LEDs that will operate at higher intensity while using less power. Higher intensity LEDs, for example, are particularly useful for displays or status indicators in various high ambient environments. There also is a relation between intensity output of the LED and the power required to drive the LED. Low power LEDs, for example, are particularly useful in various portable electronic equipment applications. An example of an attempt to meet this need for higher intensity, lower power, and more efficient LEDs may be seen with the development of the AlGaAs LED technology for LEDs in the red portions of the visible spectrum. A similar continual need has been felt for LEDs that will emit in the blue and ultraviolet regions of the visible spectrum. For example, because blue is a primary color, its presence is either desired or even necessary to produce full color displays or pure white light.

The common assignee of the present patent application was the first in this field to successfully develop commercially viable LEDs available in large quantities and that emitted light in the blue color spectrum. These LEDs were formed in silicon carbide, a wide bandgap semiconductor material. Examples of such blue LEDs are described in U.S. Pat. Nos. 4,918,497 and 5,027,168 to Edmond each titled *"Blue Light Emitting Diode Formed In Silicon Carbide."*

Other examples of such a blue LED are described in U.S. Pat. No. 5,306,662 to Nakamura et al. titled "Method Of Manufacturing P-Type Compound Semiconductor" and U.S. Pat. No. 5,290,393 to Nakamura titled *"Crystal Growth Method For Gallium Nitride-Based Compound Semiconductor."* U.S. Pat. No. 5,273,933 to Hatano et al. titled *"Vapor Phase Growth Method Of Forming Film In Process Of Manufacturing Semiconductor Device"* also describes LEDs formed of GaInAlN on SiC substrates and Zinc Selenide (ZnSe) on gallium arsenide (GaAs) substrates.

As known to those familiar with photonic devices such as LEDs, the frequency of electromagnetic radiation (i.e., the photons) that can be produced by a given semiconductor material are a function of the material's bandgap. Smaller bandgaps produce lower energy, longer wavelength photons, while wider bandgap materials are required to produce higher energy, shorter wavelength photons. For example, one semiconductor commonly used for lasers is indium gallium aluminum phosphide (InGaAlP). Because of this material's bandgap (actually a range of bandgaps depending upon the mole or atomic fraction of each element present), the light that InGaAlP can produce is limited to the red portion of the visible spectrum, i.e., about 600 to 700 nanometers (nm).

Working backwards, in order to produce photons that have wavelengths in the blue or ultraviolet portions of the spectrum, semiconductor materials are required that have relatively large bandgaps. Typical candidate materials include silicon carbide (SiC) and gallium nitride (GaN).

Shorter wavelength LEDs offer a number of advantages in addition to color. In particular, when used in optical storage and memory devices (e.g., "CD-ROM" or "optical disks"), their shorter wavelengths enable such storage devices to hold proportionally more information. For example, an optical device storing information using blue light can hold approximately 32 times as much information as one using red light, in the same space.

Gallium nitride, however, is an attractive LED candidate material for blue and UV frequencies because of its relatively high bandgap (3.36 eV at room temperature) and because it is a direct bandgap material rather than an indirect bandgap material. As known to those familiar with semiconductor characteristics, a direct bandgap material is one in which an electron's transition from the valence band to the conduction band does not require a change in crystal momentum for the electron. In indirect semiconductors, the alternative situation exists; i.e., a change of crystal momentum is required for an electron's transition between the valence and conduction bands. Silicon and silicon carbide are examples of such indirect semiconductors.

Generally speaking, an LED formed in a direct bandgap material will perform more efficiently than one formed in an indirect bandgap material because the photon from the direct transition retains more energy than one from an indirect transition.

Gallium nitride suffers from a different disadvantage, however: the failure to date of any workable technique for producing bulk single crystals of gallium nitride which could form appropriate substrates for gallium nitride photonic devices. As is known to those familiar with semiconductor devices, they all require some sort of structural substrate. Typically, a substrate formed of the same materials as the active region of a device offers significant advantages, particularly in crystal growth and matching. Because gallium nitride has yet to be formed in such bulk crystals, however, gallium nitride photonic devices must be formed in epitaxial layers on different—i.e., other than GaN—substrates.

Using different substrates, however, causes an additional set of problems, mostly in the area of crystal lattice matching. In almost all cases, different materials have different crystal lattice parameters. As a result, when a gallium nitride epitaxial layer is grown on a different substrate, some crystal mismatch will occur, and the resulting epitaxial layer is referred to as being "strained" by this mismatch. Such mismatches, and the strain they produce, carry with them the potential for crystal defects which in turn affect the electronic characteristics of the crystals and the junctions, and thus correspondingly tend to degrade or even prevent the performance of the photonic device. Such defects are even more problematic in higher power structures.

To date, the most common substrate for gallium nitride devices—and the only substrate utilized in GaN LED's—has been sapphire; i.e., aluminum oxide ($Al_2O_3$). Sapphire is optically transparent in the visible and UV ranges, but is unfortunately insulating rather than conductive, and carries a lattice mismatch with gallium nitride of about 16%. In the absence of a conductive substrate, "vertical" devices (those with contacts on opposite sides) cannot be formed, thus complicating the manufacture and use of the devices.

As a particular disadvantage, horizontal structures (those with contacts on the same side of the device), such as those required when gallium nitride is formed on sapphire, also produce a horizontal flow of current and therefore the current density through the layer is substantially increased. This horizontal current flow puts an additional strain on the already-strained (i.e., the 16% lattice mismatch) GaN-sapphire structure and accelerates the degradation of the junction and the device as a whole.

Gallium nitride also carries a lattice mismatch of about 2.4% with aluminum nitride (AlN) and a 3.5% mismatch with silicon carbide. Silicon Carbide has a somewhat lesser mismatch (only about 1%) with aluminum nitride.

Group III ternary and quaternary nitrides (e.g., InGaN, InGaAlN, etc.) have also been shown to have relatively wide bandgaps and thus also offer the potential for blue and ultraviolet semiconductor lasers. Most of these compounds, however, present the same difficulty as gallium nitride: the lack of an identical single crystal substrate. Thus, each must be used in the form of epitaxial layers grown on different substrates. Thus, they present the same potential for crystal defects and their associated electronic problems.

OBJECT AND SUMMARY OF THE INVENTION

Therefore, it is an object of the present invention to provide a light emitting diode that can emit in the blue and ultraviolet portions of the electromagnetic spectrum, that can be built in the vertical geometry that is most advantageous for such devices, that has excellent brightness and efficiency and that can exhibit better physical and electronic longevity and performance than can previously available diodes.

The invention meets this object with a light emitting diode that emits in the blue portion of the visible spectrum and that is characterized by an extended lifetime because of its advantageous materials and structure. The light emitting diode comprises a conductive silicon carbide substrate; an ohmic contact to the silicon carbide substrate; a conductive buffer layer on the substrate and selected from the group consisting of gallium nitride, aluminum nitride, indium nitride, ternary Group III nitrides having the formula $A_xB_{1-x}N$, where A and B are Group III elements and where x is zero, one, or a fraction between zero and one, quaternary Group III nitrides having the formula $A_xB_yC_{1-x-y}N$ where A, B, and C are Group III elements; x and y, are zero, one, or a fraction between zero and one, and 1 is greater than (x+y), and alloys of silicon carbide with such ternary and quaternary Group III nitrides; and a double heterostructure including a p-n junction on the buffer layer in which the active and heterostructure layers are selected from the group consisting of binary Group III nitrides, ternary Group III nitrides, quaternary Group III nitrides, and alloys of silicon carbide with such nitrides.

The foregoing and other objects, advantages and features of the invention, and the manner in which the same are accomplished, will become more readily apparent upon consideration of the following detailed description of the invention taken in conjunction with the accompanying drawings, which illustrate preferred and exemplary embodiments, and wherein:

DETAILED DESCRIPTION OF A PREFERRED EMBODIMENT

The present invention is a light-emitting diode that produces light in the blue portion of the visible spectrum and that is characterized by an extended lifetime. As known to those familiar with the performance, characteristics and ratings of such light-emitting diodes, the lifetime is generally defined as the time over which the LED's output will degrade to about 50% of its original output.

Figure 1:
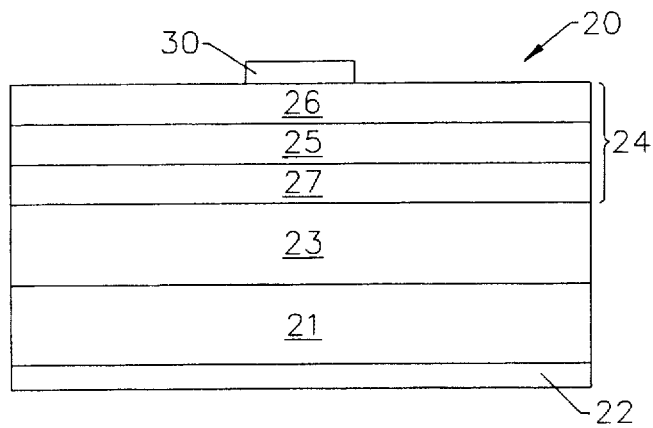
FIG. 1 schematically illustrates a vertical sectional view of a first embodiment of an extended lifetime light emitting diode according to the present invention.

FIG. 1 is a cross-sectional schematic view of a light-emitting diode according to the present invention and generally designated at 20. The diode comprises a conductive silicon carbide substrate 21 which, in preferred embodiments, is a single crystal silicon carbide substrate. As is well understood by those of ordinary skill in this art, a high quality single crystal substrate provides a number of structural advantages that in turn provide significant performance and lifetime advantages. In preferred embodiments, the SiC substrates can be formed by the methods described in U.S. Pat. No. 4,866,005 (now U.S. Pat. No. RE 34,861) which is commonly assigned with the pending application.

An ohmic contact 22 is made to the silicon carbide substrate and is one of the characteristics of the present invention that immediately distinguishes it from prior diodes of the materials discussed herein. As noted earlier, the typical substrate for gallium nitride is sapphire, which cannot be made conductive, and thus cannot be connected to an ohmic contact. This prevents a sapphire-based device from being formed in the vertical structure that is most preferred for LEDs and many other devices.

FIG. 1 further illustrates that the LED 20 comprises a buffer layer 23 on the substrate 21. The buffer layer 23 is selected from the group consisting of gallium nitride, aluminum nitride, indium nitride, ternary Group III nitrides having the formula $A_xB_{1-x}N$, where A and B are Group III elements and where x is zero, one or a fraction between zero and one, quaternary Group III nitrides having the formula $A_xB_yC_{1-x-y}N$ where A, B, and C are Group III elements, x and y, are zero, one, or a fraction between zero and one, and 1 is greater than (x+y) and alloys of silicon carbide with such ternary and quaternary Group III nitrides. The buffer layer 23 and the substrate 21 are both conductive.

The LED 20 further includes a double heterostructure designated by the brackets 24, and specifically including a p-n junction, on the buffer layer 23. The structural designation "double heterostructure" is used in a manner common to, and well understood in, this art. Aspects of these structures are discussed, for example, in Sze, *Physics of Semiconductor Devices*, Second Edition (1981) at pages 708–710. The Sze discussion on those pages refers to lasers, but illustrates the nature of, and the distinction between, homostructure, single heterostructure, and double heterostructure junctions.

In the embodiment illustrated in FIG. 1, the double heterostructure 24 further comprises an active layer 25 along with upper 26 and lower 27 heterostructure layers adjacent the active layer 25. The heterostructure layers 26 and 27 are preferably formed of a composition selected from the group consisting of gallium nitride, aluminum nitride, indium nitride, ternary Group III nitrides having the formula $A_xB_{1-x}N$, where A and B are Group III elements and where x is zero, one or a fraction between zero and one, and alloys of silicon carbide with such ternary Group III nitrides, e.g., $(SiC)_xA_yB_{1-y}N$. Stated differently, the lowest heterostructure layer will be on top of the buffer layer. In FIG. 1, this is illustrated as lower heterostructure 27 being on top of buffer layer An ohmic contact 30 can be applied to the upper heterostructure layer 26 to complete the advantageous vertical structure of the invention. The ohmic contacts preferably are each formed of a metal such as aluminum (Al), gold (Au), platinum (Pt), or nickel (Ni), but may be formed of other material for forming ohmic contacts as understood by those skilled in the art.

In each of the embodiments illustrated herein, the double heterostructure comprises an active layer selected from the group consisting of gallium nitride, aluminum nitride, indium nitride, ternary Group III nitrides having the formula $A_xB_{1-x}N$, where A and B are Group III elements and where x is zero, one or a fraction between zero and one, and alloys of silicon carbide with such ternary Group III nitrides.

In the heterostructure 24 illustrated in FIG. 1, the active layer 25 can preferably comprise indium gallium nitride and the upper and lower heterostructure layers 26 and 27 will preferably comprise aluminum gallium nitride. More specifically, the aluminum gallium nitride heterostructure layers 26 and 27 preferably have the formula $Al_xGa_{1-x}N$ where x is zero, one or a fraction between zero and one. When the active layer 25 comprises indium gallium nitride, the composition will be understood to be $In_zGa_{1-z}N$, where z is a fraction between zero and one.

As known to those of ordinary skill in this art, the composition of the ternary Group III nitrides can affect both their refractive index and their bandgap. Generally speaking, a larger proportion of aluminum increases the bandgap and decreases the refractive index. Thus, in preferred embodiments, in order for the heterostructure layers 26 and 27 to have a bandgap larger than the active layer 25 and a refractive index smaller than the active layer 25, the layers 26 and 27 have a higher atomic or mole percentage of aluminum than does the active layer 25. The larger bandgap of the heterostructure layers 26 and 27 encourages electrons to be injected through the active layer 25 thus increasing the efficiency of the device. Similarly, the lower refractive index of the heterostructure layers 26 and 27 encourage the light to be more preferably emitted on an optical basis from active layer 25.

In order to form the p-n junction, the upper and lower heterostructure layers 26 and 27 have opposite conductivity types from one another, and the active layer 25 has the same conductivity type as one of the two heterostructure layers. For example, in a preferred embodiment, the upper heterostructure layer 26 is p-type, the active layer 25 is n-type, the lower heterostructure layer 27 is n-type, and the buffer and the silicon carbide substrate are both also n-type. The p-n junction is thus formed between the active layer 25 and the upper heterostructure layer 26.

Figure 2:
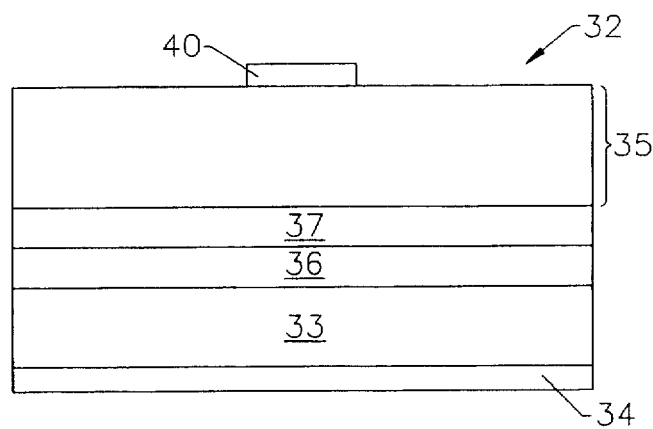
FIG. 2 schematically illustrates a vertical sectional view of a second embodiment of an extended lifetime light emitting diode according to the present invention.

FIG. 2 illustrates a slightly different embodiment of the present invention broadly designated at 32. As in the previous embodiment, the LED comprises a silicon carbide substrate 33 and its ohmic contact 34. The double heterostructure is designated by the brackets at 35. In the embodiment of FIG. 2, the buffer layer is shown at 36 and comprises gallium nitride, and the overall structure further comprises a gallium nitride epitaxial layer 37 on the buffer layer between the gallium nitride buffer layer 36 and the double heterostructure 35. An ohmic contact 40 to the double heterostructure 35 completes the advantageous vertical structure of the device.

Although specific performance parameters will be discussed later herein, the diodes described herein and illustrated in these and the remaining drawings are expected to have lifetimes of greater than 10,000 hours operating at a forward bias current of 50 milliamps at room temperature, and lifetimes of greater than 10,000 hours operating at a forward bias current of 30 milliamps at room temperature. It will be recognized by those familiar with such devices that these specifications greatly exceed those of presently available devices.

Figure 3:
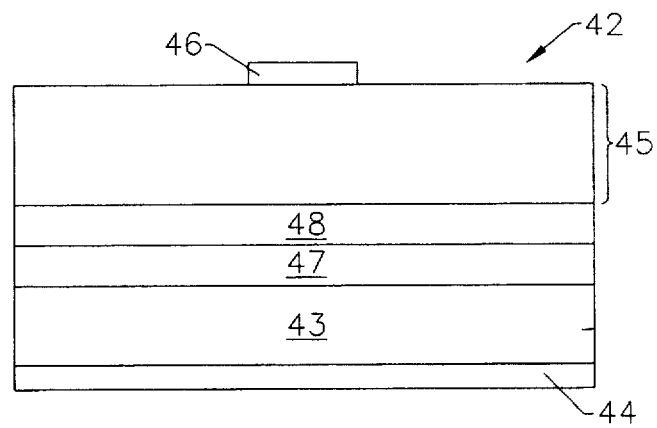
FIG. 3 schematically illustrates a vertical sectional view of a third embodiment of an extended lifetime light emitting diode according to the present invention.

FIG. 3 illustrates a third embodiment of the present invention broadly designated at 42. As in the previous embodiments, the diode 42 includes a silicon carbide substrate 43, and an ohmic contact 44 to the substrate 43. The double heterostructure is again designated by the brackets 45 and an upper ohmic contact 46 is made to the double heterostructure 45. In this embodiment, however, the buffer layer comprises first and second layers 47 and 48 respectively. The first layer 47 is on the substrate 43 and is formed of a graded composition of silicon carbide aluminum gallium nitride $(SiC)_xAl_yGa_{1-y}N$ in which the portion adjacent the substrate 43 is substantially entirely silicon carbide and the portion furthest from the substrate is substantially entirely aluminum gallium nitride, with the portions therebetween being progressively graded in content from predominantly silicon carbide to predominantly aluminum gallium nitride.

The second layer 48 is on the first layer 47 and is formed of another graded composition of aluminum gallium nitride. In preferred embodiments, the composition of the graded second layer 48 is graded from a composition matching the composition of the first buffer layer 47 at the point where the layers 47 and 48 meet, to a composition matching the composition of the lowest layer of the double heterostructure 45.

With respect to FIG. 3, the buffer layer can also be described as having at least one graded layer of silicon carbide and a Group III nitride in which the graded layer is silicon carbide at the interface with the substrate and then progressively graded to a composition matching the composition of the lowest layer of the double heterostructure at the interface with the double heterostructure.

The invention can further comprise a strain-minimizing contact layer (not shown) above the active layer in the double heterostructure and that would have a lattice constant substantially the same as the respective buffer layers. Such a strain-minimizing contact layer is set forth in an application filed concurrently herewith by Edmond and Bulman for "Low Strain Laser Structures with Group III Nitride Active Layers," which is commonly assigned with this application and which is incorporated entirely herein by reference. Briefly summarized, the overall strain of such a multilayered crystalline device is a function of the average of the individual strains based on the differences between their lattice constants. Thus, by adding a layer with a lattice constant substantially the same as the buffer, the weighted average of the strains becomes more consistent and thus reduces the overall strain.

As some additional details, the upper surface of the silicon carbide substrate in any of the embodiments can be doped with aluminum to enhance the crystal growth. As already stated, the substrate and the buffer layers in each embodiment are conductive, and this is usually accomplished by doping each of the layers with appropriate dopants. The silicon carbide substrate can be selected from several of the silicon carbide polytypes specifically including 3C, 4H, 6H, and 15R.

Figure 4:
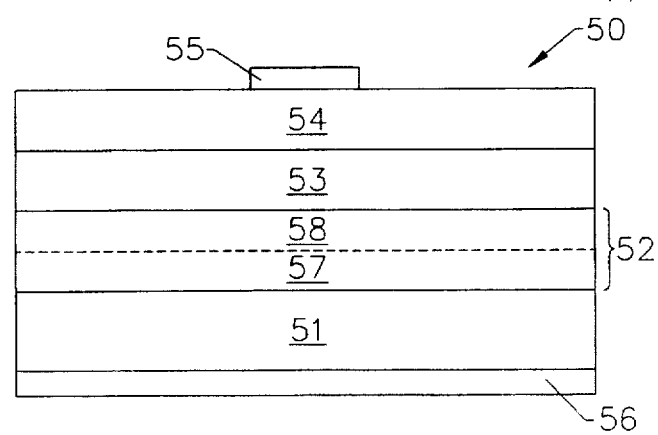
FIG. 4 schematically illustrates a vertical sectional view of a fourth embodiment of an extended lifetime light emitting diode according to the present invention.

FIG. 4 illustrates another embodiment of the present invention broadly designated at 50. The LED 50 is formed on a silicon carbide substrate 51 upon which a buffer layer designated by the brackets 52 is formed. The buffer layer is selected from the group consisting of gallium nitride, aluminum nitride, indium nitride, ternary Group III nitrides having the formula $A_xB_{1-x}N$, where A and B are Group III elements and where x is zero, one or a fraction between zero and one, and alloys of silicon carbide with such ternary Group III nitrides. A first Group III nitride layer 53 is formed on the buffer 52 and has a first conductivity type. A second Group III nitride layer 54 is formed on the first Group III nitride layer 53 and has a second conductivity type so that the first and second Group III nitride layers 53 and 54 form a p-n junction device. An ohmic contact 55 is made to the second Group III nitride layer 54, and an ohmic contact 56 is formed on the silicon carbide substrate so that a current supplied across the first and second ohmic contacts to the p-n junction device produces a high light intensity output therefrom.

As indicated by the dotted line in FIG. 4, the buffer 52 preferably comprises a first layer 57 on the substrate 51 and formed of a graded composition of silicon carbide aluminum gallium nitride in which the portion adjacent the substrate is substantially entirely silicon carbide and the portion furthest from the substrate is substantially entirely aluminum gallium nitride with the portions therebetween being progressively graded in content from predominantly silicon carbide to predominantly aluminum gallium nitride.

A second buffer layer 58 is upon the first layer 57 and is formed of a graded composition of aluminum gallium nitride. As described with respect to earlier embodiments, the composition of the graded second layer 58 is progressively graded from a composition matching the composition of the first buffer layer 57 at the point where layers 58 and 57 join, to a composition matching the composition of the lower Group III nitride layer 53 of the diode.

In the diode 50 illustrated in FIG. 4, the nitride layers 53 and 54 are selected from the group consisting of gallium nitride, aluminum nitride, indium nitride, ternary Group III nitrides having the formula $A_xB_{1-x}N$, where A and B are Group III elements and where x is zero, one or a fraction between zero and one, and alloys of silicon carbide with such ternary Group III nitrides. It will thus be understood that in this and the previous embodiment, the junction can be a homostructure, a single-heterostructure, or a double-heterostructure.

The buffer 52 can alternatively comprise a lower intermediate layer 57 formed of silicon carbide positioned on the silicon carbide substrate 51 and an upper intermediate layer 58 formed of a nitride alloy positioned on the lower intermediate layer 57.

The buffer can include at least one graded layer of silicon carbide and a Group III nitride in which the graded layer is silicon carbide at the interface with the substrate 51, and the graded layer is a composition matching the composition of the lowest layer of the active device at the interface with the junction structure.

As in earlier embodiments, the light-emitting diode can have the upper surface of the silicon carbide substrate doped with aluminum.

Figure 6:
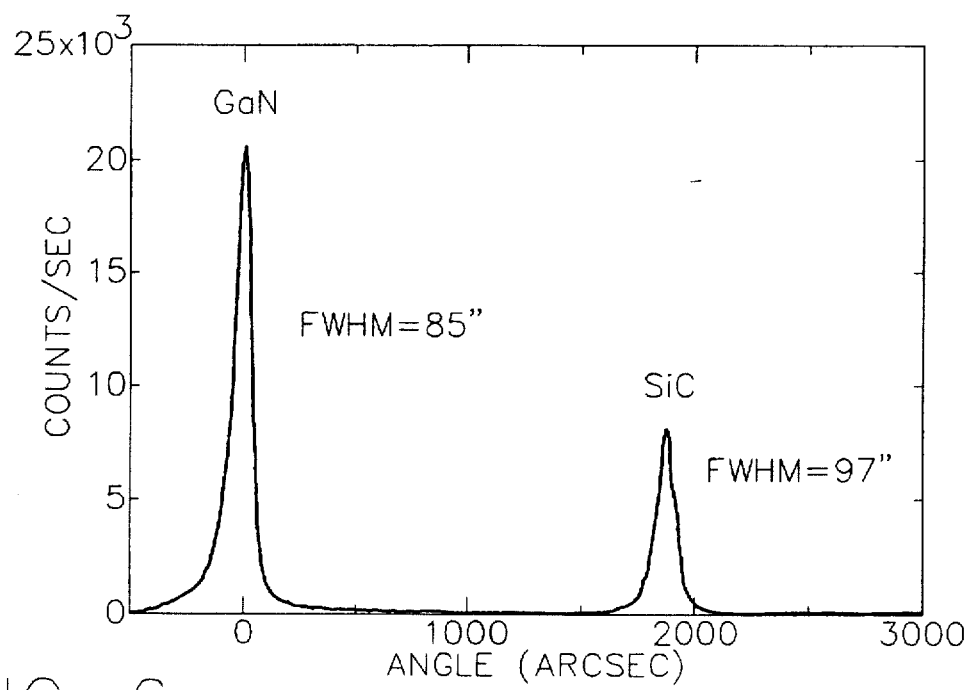
FIG. 6 graphically illustrates a double crystal X-ray rocking curve for a GaN layer on a SiC substrate as used in a light emitting diode according to the present invention.

As discussed with reference to some of the other figures herein, the characteristics of the crystals according to the present invention are generally superior to any exhibited by any prior devices. Thus, a double crystal x-ray rocking curve for GaN grown on SiC substrates according to the present invention has a full width half maximum of about 85 arcseconds (FIG. 6).

Figure 5:
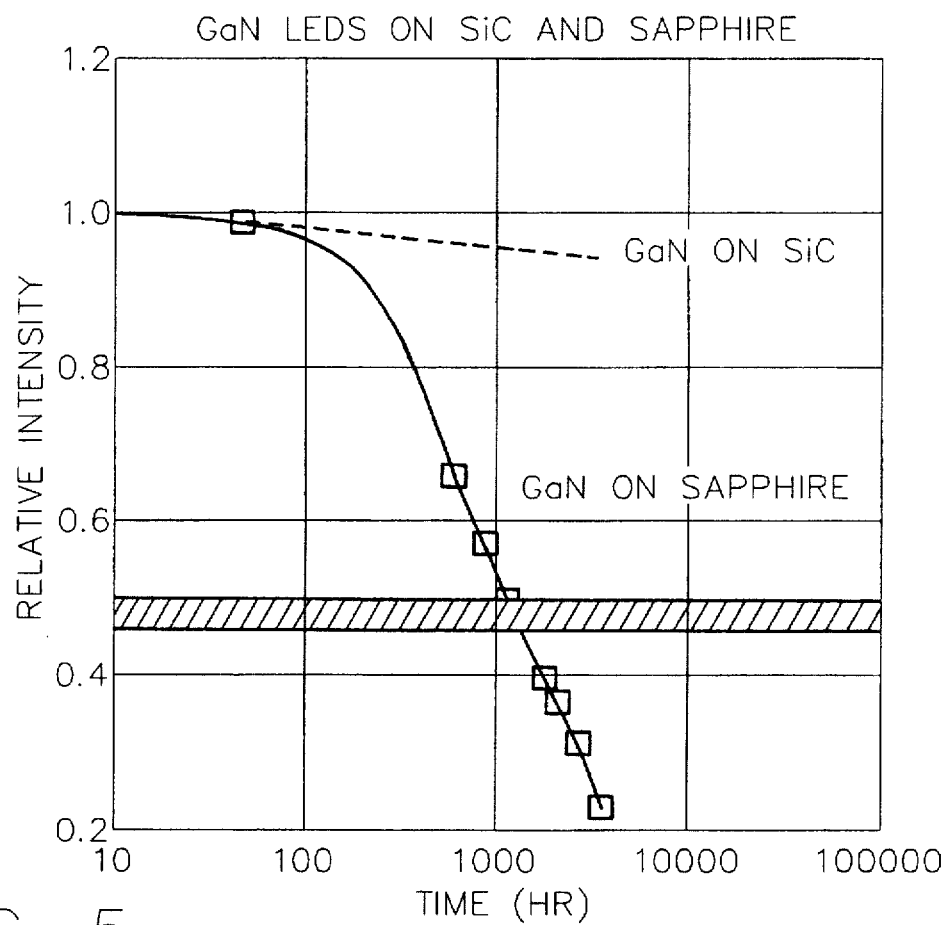
FIG. 5 graphically illustrates relative intensity over time of a prior art light emitting diode in comparison to a light emitting diode according to the present invention.

As noted above, the lifetime of an LED is defined by the LED degradation time to a light emitting output of only about 50% of the initial light emitting output of the LED. As set forth above, FIG. 5 graphically illustrates relative intensity over time of a prior art LED formed of GaN on sapphire as compared to an LED according to the present invention. FIG. 5 best illustrates the significant improvement of the lifetime of an LED according to the present invention. The devices were burned in at 50 milliamps.

As illustrated in FIG. 5, after an extended period of time of supplying current to an LED according to the present invention, as much as 10,000 or more hours, the LED continues to emit a high intensity light output, i.e., greater than about 90% of the initial light intensity output, and much greater than the about 55% of the initial light intensity output exhibited by the GaN on sapphire LED after as little as 1000 hours burn-in. In FIG. 5, the dotted line predicts the performance of GaN on SiC based on the well-established performance of SiC on SiC.

Nitride alloys are often difficult to grow two-dimensionally on silicon carbide using conventional technology, primarily because of the difference in the surface energy between the two kinds of materials. More specifically, conventional growth techniques at relatively high temperatures (i.e., higher than about 1000° C.) tend to cause three-dimensional growth on the upper surface of the silicon carbide substrate. This three-dimensional growth occurs to such an extent as to form small individual islands of semiconductor material on the upper surface of the substrate with a poor surface coverage. Further growth of these islands is still three-dimensional, and results in very rough as-grown surface of nitride alloys. At relatively low temperatures, i.e., less than 1000° C., however, much smaller islands of nitride alloys with much higher density can be grown on the surface of the silicon carbide substrate. After a very short period of further growth at the conventional growth temperatures, these islands coalescence and cover almost all the upper surface of the substrate. Further growth on this surface is the growth of nitride alloys on nitride alloys and is dominated by two-dimensional lateral growth. This results in specular as-grown surface of the film and high electrical and structural quality of the nitride alloys. The p-n junction device of a Group III nitride is then formed on the gallium nitride layer using techniques such as chemical vapor deposition (CVD) or molecular beam epitaxy (MBE); see e.g., commonly assigned U.S. Pat. No. 5,210,051.

FIGS. 6–9 illustrate various other performance and construction characteristics of an extended lifetime LED according to the present invention. More particularly, FIG. 6 graphically illustrates a double crystal X-ray rocking curve, i.e., counts per second as compared to angle, for a GaN layer on a SiC substrate according to the present invention. An analysis of the angular position, intensity, and peak width of x-ray beams diffracted by crystalline material provides information on the crystal structure of the material. In this example, the full width half maximum (FWHM) for the base GaN of an LED according to the present invention was found to be about 85 arcseconds. Because the X-ray rocking curve measurements indicate that the crystal quality of the GaN on SiC substrate are relatively high, resulting LED are expected to provide the high intensity, and long lifetime characteristics that are desired.

Figure 7:
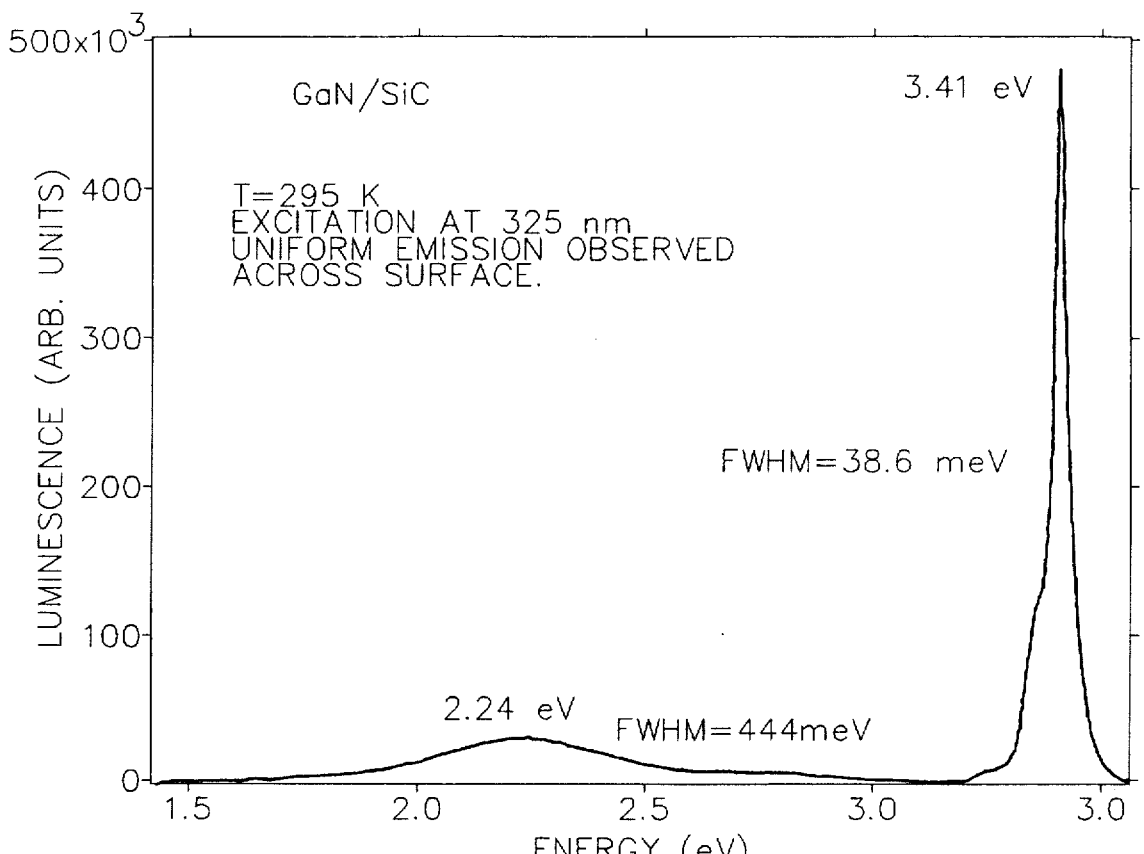
FIG. 7 graphically illustrates photoluminescence as compared to energy output of a GaN layer on a SiC substrate as utilized in an extended lifetime light emitting diode according to the present invention.

FIG. 7 graphically illustrates luminescence as compared to energy output of the base GaN on SiC of an extended lifetime LED according to the present invention. The graph illustrates the results of photoluminescence measurements at an excitation of 325 nm, and a temperature of 295 K. Uniform emission was observed across the surface. Room temperature photoluminescence shows that the emission is dominated by the band edge exiton at 3.41 eV which is typically dominated by the defect peak at 2.2 eV for layers grown on sapphire, again indicating the high quality of GaN on SiC substrates according to the present invention.

Figure 8:
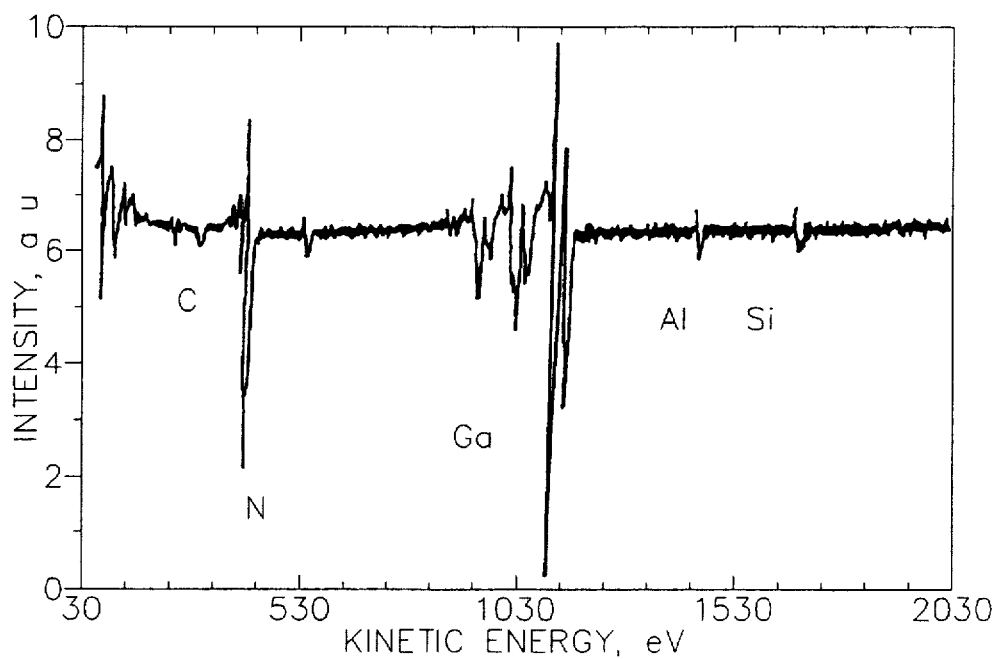
FIG. 8 graphically illustrates intensity as compared to kinetic energy of an alloy of SiC-AlN-GaN.

FIG. 8 is an Auger electron spectrum showing that an alloy layer according to the present invention contained all five elements in the SiC-AlN-GaN alloy: Si, C, Al, N and Ga. Cathodoluminescense measurements were performed on SiC-AlN-GaN alloy layers at about 80° Kelvin (K.) and showed several peaks in the ultraviolet (UV) and violet regions.

Figure 9:
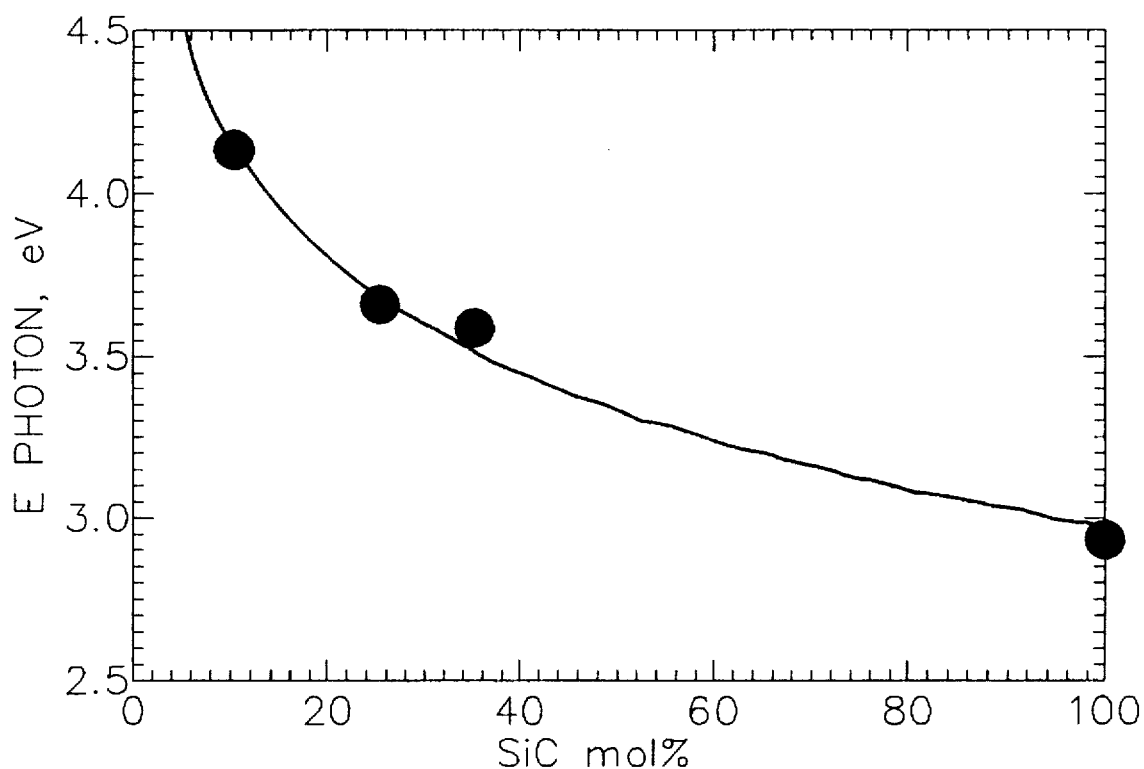
FIG. 9 graphically illustrates crystal lattice peak energy as a function of silicon carbide concentration in a SiC-AlN-GaN alloy according to the present invention.

FIG. 9 graphically illustrates the resulting edge peak energy as a function of silicon carbide concentration for these layers according to the present invention. As shown, the photon energy for the edge peak depends on the SiC concentration in the alloy layer. For a layer with a SiC concentration of about 10 mole %, the edge peak was detected at a wavelength of about 300 nm.

In the drawings and specification, there has been disclosed typical preferred embodiments of the invention and, although specific terms are employed, the terms are used in a generic and descriptive sense only and not for the purposes of limitation. The invention has been described in considerable detail with specific reference to various preferred embodiments. It will be apparent, however, that various modifications and changes can be made within the spirit and scope of the invention as described in the foregoing specification and defined in the appended claims.

That which is claimed is:

1. A light emitting diode that emits in the blue portion of the visible spectrum and that is characterized by an extended lifetime, said light emitting diode comprising:

a conductive silicon carbide substrate;

an ohmic contact to said silicon carbide substrate;

a conductive buffer layer on said substrate and selected from the group consisting of gallium nitride, aluminum nitride, indium nitride, ternary Group III nitrides having the formula $A_xB_{1-x}N$, where A and B are Group III elements and where x is zero, one, or a fraction between zero and one, quaternary Group III nitrides having the formula $A_xB_yC_{1-x-y}N$ where A, B, and C are Group III elements; x and y, are zero, one, or a fraction between zero and one, and 1 is greater than (x+y), and alloys of silicon carbide with such ternary and quaternary Group III nitrides; and a p-n junction diode heterostructure on said buffer layer in which the p-type and n-type layers are selected from the group consisting of binary Group III nitrides and ternary Group III nitrides.

2. A light emitting diode according to claim 1 wherein said p-n junction diode heterostructure comprises a single heterostructure.

3. A light emitting diode according to claim 1 wherein said p-n junction diode heterostructure comprises a double heterostructure in which the active and heterostructure layers are selected from the group consisting of binary Group III nitrides and ternary Group III nitrides.

4. A light emitting diode according to claim 1 wherein said buffer layer comprises gallium nitride.

5. A light emitting diode according to claim 1 and further comprising a gallium nitride epitaxial layer on said buffer layer between said gallium nitride buffer layer and said junction diode structure.

6. A light emitting diode according to claim 1 and having a lifetime of greater than 10,000 hours at 50 milliamps at room temperature.

7. A light emitting diode according to claim 1 and having a lifetime of greater than 10,000 hours at 30 milliamps at room temperature.

8. A light emitting diode according to claim 1 and further comprising an ohmic contact to the top of said junction diode structure, and wherein said ohmic contact to said substrate is on the bottom of said substrate to thereby form a vertical device structure.

9. A light emitting diode according to claim 3 wherein said double heterostructure comprises:

an active layer; and upper and lower heterostructure layers adjacent said active layer, and formed of a composition selected from the group consisting of gallium nitride, aluminum nitride, indium nitride, ternary Group III nitrides having the formula $A_xB_{1-x}N$, where A and B are Group III elements and where x is zero, one, or a fraction between zero and one, and alloys of silicon carbide with such ternary Group III nitrides.

10. A light emitting diode according to claim 3 wherein said double heterostructure comprises an active layer selected from the group consisting of gallium nitride, aluminum nitride, indium nitride, ternary Group III nitrides having the formula $A_xB_{1-x}N$, where A and B are Group III elements and where x is zero, one, or a fraction between zero and one, and alloys of silicon carbide with such ternary Group III nitrides.

11. A light emitting diode according to claim 9 wherein said heterostructure layers have the formula $Al_xGa_{1-x}N$, and where x is 0, 1, or a fraction between 0 and 1.

12. A light emitting diode according to claim 9 wherein said heterostructure layers have a bandgap larger than said active layer.

13. A light emitting diode according to claim 9 wherein said heterostructure layers have a refractive index smaller than said active layer.

14. A light emitting diode according to claim 9 wherein said upper heterostructure layer has the opposite conductivity type from said lower heterostructure layer.

15. A light emitting diode according to claim 14 wherein said upper heterostructure layer is p-type and said active layer and said lower heterostructure layer are n-type.

16. A light emitting diode according to claim 14 wherein said upper heterostructure layer and said active layer are n-type and said lower heterostructure layer is p-type.

17. A light emitting diode according to claim 9 wherein said active layer has the composition $In_zGa_{1-z}N$, where z is a fraction between zero and one.

18. A light emitting diode according to claim 1 wherein said buffer layer comprises:
   a first layer upon said substrate formed of a graded composition of silicon carbide aluminum gallium nitride in which the portion adjacent the substrate is substantially entirely silicon carbide and the portion furthest from the substrate is substantially entirely aluminum gallium nitride with the portions therebetween being progressively graded in content from predominantly silicon carbide to predominantly aluminum gallium nitride; and
   a second layer upon said first layer and formed of a graded composition of aluminum gallium nitride.

19. A light emitting diode according to claim 18 wherein the composition of said graded second layer is progressively graded from a composition matching the composition of said first buffer layer to a composition matching the composition of the lowest layer of said double heterostructure.

20. A light emitting diode according to claim 1 wherein said buffer includes at least one graded layer of silicon carbide and a group III nitride in which the graded layer is silicon carbide at the interface with said substrate, and the graded layer is a composition matching the composition of the lowest layer of said double heterostructure at the interface with said double heterostructure.

21. A light emitting diode according to claim 1 and further comprising a strain-minimizing contact layer above said double heterostructure that has a lattice constant substantially the same as said buffer layer.

22. A light emitting diode according to claim 1 wherein an upper surface of said silicon carbide substrate is doped with aluminum.

23. A light emitting diode according to claim 1 wherein said substrate and said buffer layer are each doped with impurities.

24. A light emitting diode according to claim 1 wherein said silicon carbide substrate has a polytype selected from the group consisting of 3C, 4H, 6H, and 15R.

25. A light emitting diode (LED) having an extended light emitting lifetime, the LED comprising:
   a conductive silicon carbide substrate;
   a conductive buffer layer on said silicon carbide substrate and selected from the group consisting of gallium nitride, aluminum nitride, indium nitride, ternary Group III nitrides having the formula $A_xB_{1-x}N$, where A and B are Group III elements and where x is zero, one, or a fraction between zero and one, quaternary Group III nitrides having the formula $A_xB_yC_{1-x-y}N$ where A, B, and C are Group III elements; x and y, are zero, one, or a fraction between zero and one, and 1 is greater than (x+y), and alloys of silicon carbide with such ternary Group III nitrides;
   a first Group III nitride layer formed on said buffer layer, said first Group III nitride layer having a first conductivity type;
   a second Group III nitride layer formed on said first Group III nitride layer, said second Group III nitride layer having a second conductivity type so that said first and second Group III nitride layers form a p-n junction device;
   said first and second Group III nitride layers forming a heterostructure;
   an ohmic contact formed on said second Group III nitride layer; and
   a second ohmic contact formed on said silicon carbide substrate so that a current supplied across said first and second ohmic contacts to the p-n junction device produces a high light intensity output therefrom.

26. A light emitting diode according to claim 25 wherein said nitride layers are selected from the group consisting of gallium nitride, aluminum nitride, indium nitride, ternary Group III nitrides having the formula $A_xB_{1-x}N$, where A and B are Group III elements and where x is zero, one, or a fraction between zero and one, quaternary Group III nitrides having the formula $A_xB_yC_{1-x-y}N$ where A, B, and C are Group III elements; x and y, are zero, one, or a fraction between zero and one, and 1 is greater than (x+y), and alloys of silicon carbide with such ternary Group III nitrides.

27. A light emitting diode according to claim 25 wherein said first and second Group III nitride layers comprise a single heterostructure.

28. A light emitting diode according to claim 25 wherein said first and second Group III nitride layers comprise a double heterostructure.

29. A light emitting diode according to claim 25, wherein said conductive buffer layer comprises a lower intermediate layer formed of silicon carbide positioned on said silicon carbide substrate and an upper intermediate layer formed of a nitride alloy positioned on said lower intermediate layer.

30. A light emitting diode according to claim 25 wherein said buffer layer comprises:
   a first layer upon said substrate formed of a graded composition of silicon carbide aluminum gallium nitride in which the portion adjacent the substrate is substantially entirely silicon carbide and the portion furthest from the substrate is substantially entirely aluminum gallium nitride with the portions therebetween being progressively graded in content from predominantly silicon carbide to predominantly aluminum gallium nitride; and a second layer upon said first layer and formed of a graded composition of aluminum gallium nitride.

31. A light emitting diode according to claim 25 wherein the composition of said graded second layer is progressively graded from a composition matching the composition of said first buffer layer to a composition matching the composition of the lowest layer of said junction device.

32. A light emitting diode according to claim 25 wherein said buffer includes at least one graded layer of silicon carbide and a group III nitride in which the graded layer is silicon carbide at the interface with said substrate, and the graded layer is a composition matching the composition of the lowest layer of said junction device at the interface of said junction device with said graded layer.

33. A light emitting diode according to claim 25, wherein an upper surface of said silicon carbide substrate is doped with aluminum.

34. A light emitting diode according to claim 25, wherein said first and second Group III nitride layers are formed of gallium nitride, and wherein a double crystal X-ray rocking curve for the light emitting diode has a full width half maximum of about 85 arcseconds for GaN.

35. A light emitting diode that emits in the blue portion of the visible spectrum and that is characterized by an extended lifetime, said light emitting diode comprising:

a conductive silicon carbide substrate;

an ohmic contact to said silicon carbide substrate;

a conductive buffer on said substrate, said buffer comprising a first layer upon said substrate formed of a graded composition of silicon carbide aluminum gallium nitride in which the portion adjacent the substrate is substantially entirely silicon carbide and the portion furthest from the substrate is substantially entirely aluminum gallium nitride with the portions therebetween being progressively graded in content from predominantly silicon carbide to predominantly aluminum gallium nitride; and a second layer upon said first layer and formed of a graded composition of aluminum gallium nitride; and a p-n junction diode structure on said buffer layer in which the p-type and n-type layers are selected from the group consisting of binary Group III nitrides and ternary Group III nitrides.

36. A light emitting diode (LED) having an extended light emitting lifetime, the LED comprising:

a conductive silicon carbide substrate;

a conductive buffer on said substrate, said buffer comprising a first layer upon said substrate formed of a graded composition of silicon carbide aluminum gallium nitride in which the portion adjacent the substrate is substantially entirely silicon carbide and the portion furthest from the substrate is substantially entirely aluminum gallium nitride with the portions therebetween being progressively graded in content from predominantly silicon carbide to predominantly aluminum gallium nitride; and a second layer upon said first layer and formed of a graded composition of aluminum gallium nitride; and a first Group III nitride layer formed on said second buffer layer, said first Group III nitride layer having a first conductivity type;

a second Group III nitride layer formed on said first Group III nitride layer, said second Group III nitride layer having a second conductivity type so that said first and second Group III nitride layers form a p-n junction device;

an ohmic contact formed on said second Group III nitride layer; and a second ohmic contact formed on said silicon carbide substrate so that a current supplied across said first and second ohmic contacts to the p-n junction device produces a high light intensity output therefrom.

\* \* \* \* \*

UNITED STATES PATENT AND TRADEMARK OFFICE
CERTIFICATE OF CORRECTION

PATENT NO. : 5,523,589
DATED : June 4, 1996
INVENTOR(S) : Edmond et al.

It is certified that error appears in the above-identified patent and that said Letters Patent is hereby corrected as shown below:

On title page, item
[56] References Cited - OTHER PUBLICATIONS

Line 17, "OCt." should be --Oct.--.

Column 5, line 55, after "layer" insert --23.--.

Signed and Sealed this

Twenty-fifth Day of March, 1997

*Attest:*

BRUCE LEHMAN

*Attesting Officer*  *Commissioner of Patents and Trademarks*